United States Patent
Agarwal et al.

(10) Patent No.: US 11,549,183 B2
(45) Date of Patent: Jan. 10, 2023

(54) SHOWERHEAD WITH INLET MIXER

(71) Applicant: Applied Materials, Inc., Santa Clara, CA (US)

(72) Inventors: Ashutosh Agarwal, San Jose, CA (US); Sanjeev Baluja, Campbell, CA (US); Dhritiman Subha Kashyap, Bangalore (IN); Kartik Shah, Saratoga, CA (US); Yanjun Xia, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 198 days.

(21) Appl. No.: 16/876,252

(22) Filed: May 18, 2020

(65) Prior Publication Data

US 2020/0370180 A1  Nov. 26, 2020

Related U.S. Application Data

(60) Provisional application No. 62/858,467, filed on Jun. 7, 2019, provisional application No. 62/852,378, filed on May 24, 2019.

(51) Int. Cl.
*C23C 16/455* (2006.01)
*H01J 37/32* (2006.01)

(52) U.S. Cl.
CPC .. *C23C 16/45565* (2013.01); *C23C 16/45542* (2013.01); *C23C 16/45544* (2013.01); *H01J 37/32449* (2013.01)

(58) Field of Classification Search
None
See application file for complete search history.

(56) References Cited

U.S. PATENT DOCUMENTS

| | | | |
|---|---|---|---|
| 6,302,964 B1 | 10/2001 | Umotoy et al. | |
| 6,883,733 B1 | 4/2005 | Lind | |
| 7,204,885 B2 | 4/2007 | Derderian | |
| 9,394,608 B2 | 7/2016 | Shero et al. | |
| 2002/0188376 A1* | 12/2002 | Derderian | H01L 21/76843 700/121 |
| 2007/0119370 A1 | 5/2007 | Ma | |
| 2008/0202425 A1 | 8/2008 | Gelatos et al. | |
| 2008/0274297 A1* | 11/2008 | Furuta | C23C 16/5096 118/715 |

(Continued)

FOREIGN PATENT DOCUMENTS

TW  201200626 A  1/2012

OTHER PUBLICATIONS

PCT International Search Report and Written Opinion in PCT/US2020/033621 dated Sep. 8, 2020, 13 pages.

*Primary Examiner* — Shamim Ahmed
*Assistant Examiner* — Bradford M Gates
(74) *Attorney, Agent, or Firm* — Servilla Whitney LLC

(57) ABSTRACT

Provided are gas distribution apparatus with a showerhead having a front plate and a back plate spaced to form a gas volume, the front plate having an inner surface adjacent the gas volume and an outer surface with a plurality of apertures extending therethrough, the gas volume having a center region and an outer region; a first inlet in fluid communication with the center region of the gas volume, the inlet having an inside and an outside; and a mixer disposed on the inside of the inlet to increase gas flow temperature. Also provided are processing chamber apparatus and methods of depositing a film.

20 Claims, 2 Drawing Sheets

(56) References Cited

U.S. PATENT DOCUMENTS

2011/0265721 A1 11/2011 Kao
2016/0032456 A1* 2/2016 Wongsenakhum .......................... C23C 16/45512
   118/725
2016/0362785 A1 12/2016 Kim et al.

* cited by examiner

SHOWERHEAD WITH INLET MIXER

CROSS-REFERENCE TO RELATED APPLICATIONS

This application claims priority to U.S. Provisional Application No. 62/852,378, filed May 24, 2019, and claims priority to U.S. Provisional Application No. 62/858,467, filed Jun. 7, 2019, the entire disclosures of which are hereby incorporated by reference herein.

TECHNICAL FIELD

The present disclosure generally relates to an apparatus and a method for providing a flow of gas into and out of a processing chamber. More specifically, embodiments of the disclosure are directed to gas distribution apparatus having a mixer disposed on the inside of the inlet of a showerhead.

BACKGROUND

In the field of semiconductor processing, flat-panel display processing or other electronic device processing, vapor deposition processes have played an important role in depositing materials on substrates. With smaller technology node, on-wafer process uniformity during steady state and transient becomes more stringent. Gas flow velocity, pressure and chemical species distributions are important for on-wafer performance. During wafer surface process, by-products are generated that changes the species composition adversely affecting wafer surface process (deposition, etch, etc.). Center feed and edge exhaust based gas distribution apparatus can lead to temperature variations and by-product accumulation from center to edge leading to on-wafer process non-uniformity.

During an atomic layer deposition (ALD) process, reactant gases are introduced into a process chamber containing a substrate. Generally, a region of a substrate is contacted with a first reactant which is adsorbed onto the substrate surface. The substrate is then contacted with a second reactant which reacts with the first reactant to form a deposited material. A purge gas may be introduced between the delivery of each reactant gas to ensure that the only reactions that occur are on the substrate surface.

Gas distribution apparatus, sometimes shaped like and referred to as showerheads, distribute processing gases to a substrate (also referred to as a wafer) at close proximity. Gas distribution apparatuses, including showerheads, have large volumes which can be very difficult to clean or purge between gases. Any gases remaining in the showerhead may react with subsequent processing gases. For ALD processes, separation of gases is important within a gas distribution apparatus, including showerheads, that relies on alternating pulses of gases, for example, an A pulse, a B pulse, an A pulse, and a B pulse type delivery. Therefore, there is an ongoing need in the art for improved gas distribution apparatuses, including showerheads.

SUMMARY

One or more embodiments of the invention are directed to gas distribution apparatuses. The apparatus comprises a showerhead having a front plate and a back plate spaced to form a gas volume, the front plate having an inner surface adjacent the gas volume and an outer surface with a plurality of apertures extending therethrough, the gas volume having a center region and an outer region; a first inlet in fluid communication with the center region of the gas volume, the first inlet having an inside and an outside; a mixer disposed on the inside of the inlet to increase gas flow temperature; and, optionally, a second inlet in fluid communication with the first inlet, the second inlet substantially perpendicular to the first inlet.

In one or more embodiments, a processing chamber apparatus comprises: a chamber body having a top wall, bottom wall and at least one sidewall defining a processing volume; a showerhead having a front plate and a back plate spaced to form a gas volume, the front plate having an inner surface adjacent the gas volume and an outer surface with a plurality of apertures extending therethrough, the gas volume having a center region and an outer region, a first inlet in fluid communication with the center region of the gas volume, the first inlet having an inside and an outside, a mixer disposed on the inside of the inlet to increase gas flow temperature, and, optionally, a second inlet in fluid communication with the first inlet, the second inlet substantially perpendicular to the first inlet; and a substrate support spaced a distance from the front plate of the showerhead.

Other embodiments are directed to a method of depositing a film on a substrate. In one or more embodiments, a method of depositing a film on a substrate comprises: flowing one or more of a precursor, an oxidant, or a reductant through a showerhead, the showerhead having a front plate and a back plate spaced to form a gas volume, the front plate having an inner surface adjacent the gas volume and an outer surface with a plurality of apertures extending therethrough, the gas volume having a center region and an outer region, a first inlet in fluid communication with the center region of the gas volume, the first inlet having an inside and an outside, a mixer disposed on the inside of the inlet to increase gas flow temperature, and, optionally, a second inlet in fluid communication with the first inlet, the second inlet substantially perpendicular to the first inlet; delivering a flow from the front plate of the showerhead to a substrate; and forming a film on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
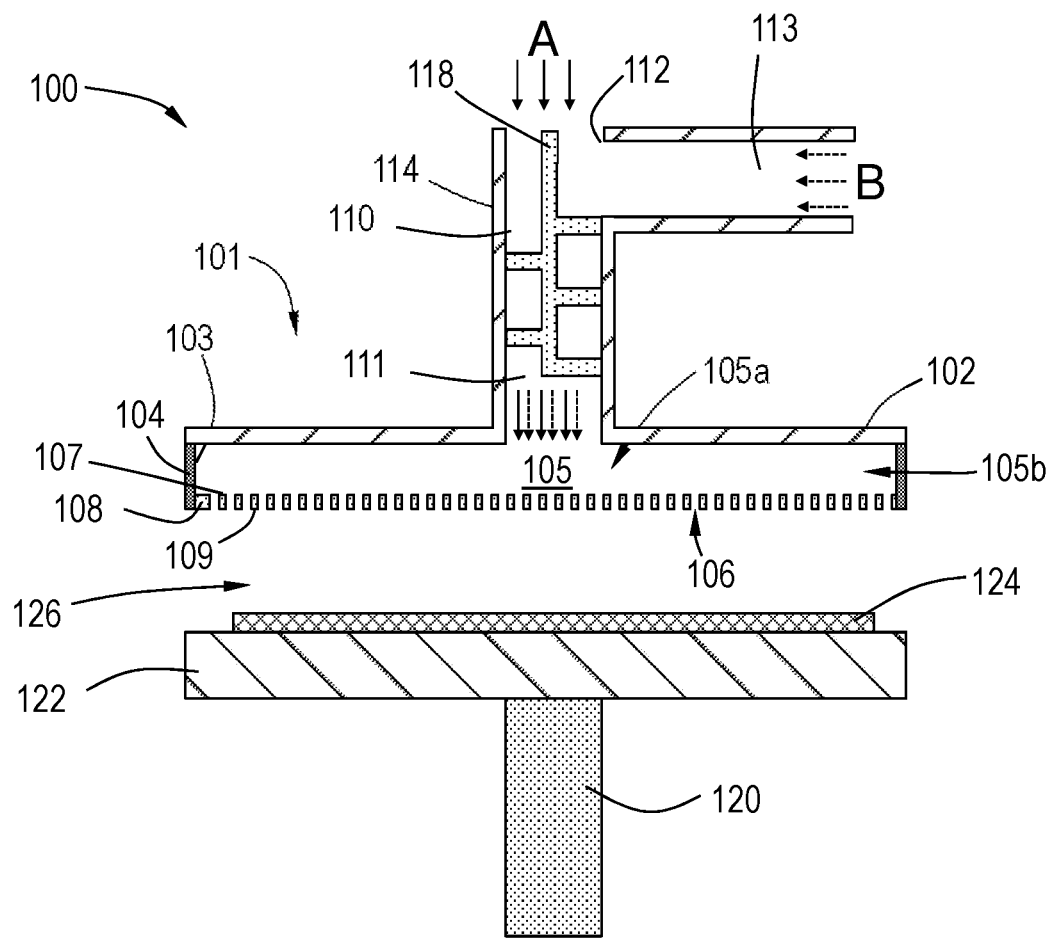
FIG. 1 shows a view of a gas distribution apparatus in accordance with one or more embodiments of the invention.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the disclosure are directed to gas distribution apparatus for use in chemical vapor deposition type processes. One or more embodiments of the disclosure are directed to atomic layer deposition processes and apparatus (also called cyclical deposition) incorporating the gas distribution apparatus described. The gas distribution apparatus described may be referred to as a showerhead or gas distribution plate, but it will be recognized by those skilled in the art that the apparatus does not need to be shaped like a showerhead or plate. The terms "showerhead" and "plate" should not be taken as limiting the scope of the disclosure.

In one or more embodiments, feed gas carrying chemical species from an inlet in fluid communication with the center region of the gas volume and having a mixer disposed on the inside of the inlet to increase gas flow temperature comes to an upper plenum (or lower plenum in a different configuration). The gas flows through the inlet and mixer into a processing volume. The process gas interacts with the wafer surface leading to surface processing (deposition or etch). The process gas with by-products is removed through the outlet. In this manner, the mixer advantageously increases the temperature of the gas flow such that pre-heating of the gas is not required, leading to improved temperature uniformity in the processing chamber. The presence of the mixed in the showerhead inlet is effective at increasing the incoming gas flow, which is cost effective because an additional preheating system is not required. Additionally, the mixer does not affect the delivery time of the precursors.

Referring to FIG. 1, one or more embodiments are directed to gas distribution apparatus 100 to deliver a gas to a process chamber (not shown). In one or more embodiments, the gas distribution apparatus is a chemical vapor deposition apparatus. The gas distribution apparatus 100 comprises a showerhead 101 having a front plate 108 and a back plate 102 spaced to form a gas volume 105, the front plate 108 having an inner surface 107 adjacent the gas volume 105 and an outer surface 109 with a plurality of apertures 106 extending therethrough.

In one or more embodiments, the gas volume 105 has a center region 105*a* and an outer region 105*b*. In one or more embodiments, an inlet 110 is in fluid communication with the center region 105*a* of the gas volume 105. In one or more embodiments, the showerhead 101 further comprises at least one side wall 104 connecting the front plate 108 to the back plate 102 and defining an outer peripheral edge 103 of the outer region 105b of the gas volume 105. In some embodiments, the at least one side wall 104 is an insulator to electrically separate the front plate 108 from the back plate 102. The insulator may be any insulator known to one of skill in the art.

In one or more embodiments, the gas distribution apparatus 100 comprises a substrate support 122 or pedestal spaced a distance from the front plate 108 of the showerhead 101. In some embodiments, the substrate support 122 comprises a heater (not illustrated). In some embodiments, the substrate support 122 holds a substrate 124. The temperature of the substrate 124 and the substrate processing region 126 may be controlled in part by the temperature controlled substrate support 122. The substrate support 122 may be thermally coupled to a cooling/heating unit (not illustrated) that adjusts the substrate support 122 and substrate 124 temperature to, for example, about −100° C. to about 100° C.

In some embodiments, one of the front plate 108 and the back plate 102 is connected to an RF power source (not illustrated) and the other of the front plate 108 and the back plate 102 is connected to electrical ground to generate a plasma within the gas volume 105. A plasma may be ignited either in the gas volume 105 or in the substrate processing region 126 below showerhead 101. In one or more embodiments, a plasma may be present in the gas volume 105 to produce a precursor from an inflow of a process gas that has traveled through the first inlet 110 comprising the mixer 118 on the inside 116 of the first inlet 110. An AC voltage typically in the radio frequency (RF) range is applied between the back plate 102 and the front plate 108 of the showerhead 101 to ignite a plasma in the gas volume 105 during deposition. An RF power supply generates a high RF frequency of 13.56 MHz but may also generate other frequencies alone or in combination with the 13.56 MHz frequency.

In some embodiments, RF energy supplied by the RF power source may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

In one or more embodiments, the first inlet 110 has an inside 112 and an outside 114. In one or more embodiments, a mixer 118 is disposed on the inside 112 of the first inlet 110 to increase gas flow temperature. The mixer 118 may have any shape and/or size such that it fits within the inside 112 of the first inlet 110. The mixer 118 can be, for example, straight, round, square, oval, rectangular, or oblong. Additionally, the overall shape of the mixer 118 can be made up of repeating units, parallel, perpendicular, or concentric to each other. In one or more embodiments, the mixer 118 has an overall shape in which there is substantially no dead space to inhibit gas flow. As used in this specification and the appended claims, the term "substantially no dead space" means that the flow of gas is inhibited by less than about 10% or by less than about 5% due to dead space.

Referring to FIG. 1, in one or more embodiments a first gas A may enter the inside 112 of first inlet 110, and a second gas B may enter the inside 112 of a second inlet 113, the second inlet 113 substantially perpendicular to the first inlet 110. As used herein, the term "substantially perpendicular" means that the general direction of the first inlet and the second inlet relative to one another is approximately perpendicular to one another. Thus, in one or more embodiments, the first inlet 110 and the second inlet 113 meet at an angle in a range of about 70° to about 110°, including about 75°, about 80°, about 85°, about 90°, about 95°, about 100°, or about 105°. In one or more embodiments, the mixer 118 aids in mixing the first gas A and the second gas B such that a mixture of first gas A and second gas B exit the outlet 111 and enter the gas volume 105. In one or more embodiments, the mixer 118 aids in achieving a substantially uniform concentration of first gas A and second gas B at the substrate support 122, ensuring a uniform concentration on the substrate 124.

In one or more embodiments, the mixer 118 is located at the entrance of the first inlet 110. In other embodiments, the mixer 118 is disposed at some point between the entrance of the first inlet 110 and about the center of the first inlet 110. In still further embodiments, the mixer 118 is disposed in the center of the first inlet 110. In yet further embodiments, the first inlet 110 is disposed at some point between the entrance of the first inlet 110 and about the top of the back plate 102 of the showerhead 101 (i.e. in the outlet 111).

In one or more embodiments, the back plate 102 of the showerhead 101 is angled toward the front plate 108 at the outer region 105b of the gas volume 105 to form a funnel shape. For example, in some embodiments, the back plate 102 of the showerhead 101 is tapered toward the front plate 108 at the outer region 105b of the gas volume 105 such that the showerhead 101 is in the shape of a cone or funnel. In such embodiments, the front plate 108 has a width greater than the width of the back plate 102.

In one or more embodiments, the showerhead 101 is funnel shaped, and the first inlet 110 creates a vortex spiraling outward from the center region 105a to the outer region 105b of the gas volume 105. In some embodiment, the vortex flow helps to mix the gases within the gas volume 105. Referring to FIG. 1, in one or more embodiments first gas A enters the inside 112 of first inlet 110, and second gas B enters the inside 112 of second inlet 113, the flow of second gas B substantially perpendicular to first gas A. As used herein, the term "substantially perpendicular" means that the general direction of the flow of first gas A and second gas B relative to one another is approximately perpendicular to one another. Thus, in one or more embodiments, the first gas A and the second gas A meet at a flow angle in a range of about 70° to about 110°, including about 75°, about 80°, about 85°, about 90°, about 95°, about 100°, or about 105°. In one or more embodiments, the mixer 118 aids in mixing first gas A and second gas B such that a mixture of first gas A and second gas B exit the outlet 111 and enter the gas volume 105. The mixer 118 aids in achieving a substantially uniform concentration of first gas A and second gas B at the substrate support 122, ensuring a uniform concentration on the substrate 124.

In one or more embodiments, the front plate 108 is connected to an RF power source (not illustrated). The RF power source may provide RF power to the gas distribution apparatus 100 via the front plate 108. In some embodiments, RF energy supplied by the RF power source may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

Figure 2:
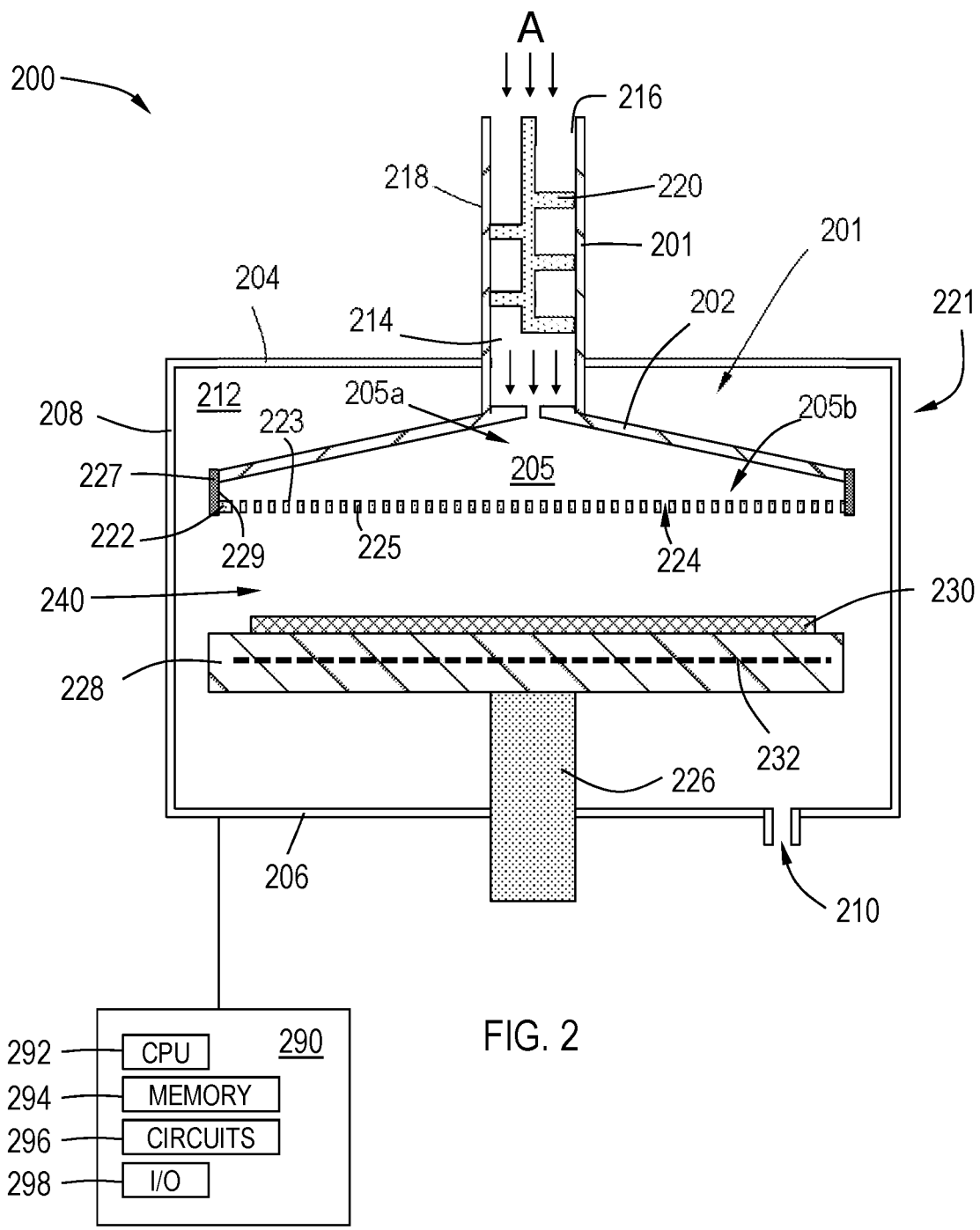
FIG. 2 shows a view of a gas distribution apparatus in accordance with one or more embodiments of the invention.

With reference to FIG. 2, one or more embodiments of the disclosure are directed to a processing chamber apparatus 200. In one or more embodiments, the processing chamber apparatus 200 comprises a chemical vapor deposition apparatus. In one or more embodiments, the processing chamber apparatus 200 comprises a chamber body 221 having a top wall 204, bottom wall 206 and at least one sidewall 208 defining a processing volume 212.

In one or more embodiments, the processing chamber apparatus 200 comprises a showerhead 201 having a front plate 222 and a back plate 202 spaced to form a gas volume 205. In one or more embodiments, the front plate 222 has an inner surface 223 adjacent the gas volume 205 and an outer surface 225 with a plurality of apertures 204 extending therethrough. In one or more embodiments, the gas volume has a center region 205a and an outer region 205b.

In one or more embodiments, the gas volume 205 has a center region 205a and an outer region 205b. In one or more embodiments, the showerhead 201 further comprises at least one side wall 227 connecting the front plate 222 to the back plate 202 and defining an outer peripheral edge 229 of the outer region 205b of the gas volume 205. In some embodiments, the at least one side wall 227 is an insulator to electrically separate the front plate 222 from the back plate 202. The insulator may be any insulator known to one of skill in the art.

In some embodiments, one of the front plate 222 and the back plate 202 is connected to an RF power source (not illustrated) and the other of the front plate 222 and the back plate 202 is connected to electrical ground to generate a plasma within the gas volume 205. A plasma may be ignited either in the gas volume 205 or in the substrate processing region 240 below showerhead 201. In one or more embodiments, a plasma may be present in the gas volume 205 to produce a precursor from an inflow of a process gas that has traveled through the first inlet 214 comprising the mixer 220 on the inside 216 of the first inlet 214. An AC voltage typically in the radio frequency (RF) range is applied between the back plate 202 and the front plate 222 of the showerhead 201 to ignite a plasma in the gas volume 205 during deposition. An RF power supply generates a high RF frequency of 13.56 MHz but may also generate other frequencies alone or in combination with the 13.56 MHz frequency. In some embodiments, RF energy supplied by the RF power source may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

In other embodiments, not illustrated, the showerhead 201 does not comprise at least one side wall 227, such that the front plate 222 is directly connected to the back plate 202, defining the gas volume 205.

In one or more embodiments, not illustrated, there may be a second inlet substantially perpendicular to the first inlet 214 for flowing a second gas through the mixer 220.

Referring to FIG. 2, the processing chamber apparatus 200 of one or more embodiments comprises an inlet 214 in fluid communication with the center region 205a of the gas volume 205. In one or more embodiments, the first inlet 214 has an inside 216 and an outside 218. A mixer 220 is disposed on the inside 216 of the first inlet 214 to increase gas flow temperature. The mixer 220 may have any shape and/or size such that it fits within the inside 216 of the inlet 210. The mixer 220 can be, for example, straight, round, square, oval, rectangular, or oblong. Additionally, the overall shape of the mixer 220 can be made up of repeating units, parallel, perpendicular, or concentric to each other. In one or more embodiments, the mixer 220 has an overall shape in which there is substantially no dead space to inhibit gas flow. As used in this specification and the appended claims, the term "substantially no dead space" means that the flow of gas is inhibited by less than about 10% or by less than about 5% due to dead space. Referring to FIG. 2, in one or more embodiments a first gas A enters the inside 216 of first inlet 214 and passes through the mixer 220. In one or more embodiments, the temperature of the mixer is about 180° C., and the temperature of the back plate 202 and vertical manifold 201 is about 200° C. In one or more embodiments, the mixer 220 aids in forcing first gas A to the vertical manifold 201 and aids in increasing the temperature of first gas A in the first inlet 214 from about 30° C. to about 200° C.

In one or more embodiments, the mixer 220 is located at the entrance of the first inlet 214. In other embodiments, the mixer 220 is disposed at some point between the entrance of the first inlet 214 and about the center of the first inlet 214. In still further embodiments, the mixer 220 is disposed in the center of the first inlet 214. In yet further embodiments, the mixer 220 is disposed at some point between the entrance of the first inlet 214 and about the top of the back plate 202 of the showerhead 201.

In one or more embodiments, the back plate 202 of the showerhead 201 is angled toward the front plate 222 at the outer region 205b of the gas volume 205 to form a funnel shape, as illustrated in FIG. 2. For example, in some embodiments, the back plate 202 of the showerhead 201 is tapered toward the front plate 222 at the outer region 205b of the gas volume 205 such that the showerhead 201 is in the shape of a cone or funnel. In such embodiments, the front plate 222 has a width greater than the width of the back plate 202.

In one or more embodiments, the showerhead 201 is funnel shaped, as illustrated, and the first inlet 214 creates a vortex spiraling outward from the center region 205a to the outer region 205b of the gas volume 205. In some embodiments, the vortex flow helps to mix the gases within the gas volume 205 and aids in creating a substantially uniform concentration of first gas A at the substrate support 228 and the substrate 230.

In one or more embodiments, the front plate 222 is connected to an RF power source (not illustrated). The RF power source may provide RF power to the gas distribution apparatus 200 via the front plate 222. In some embodiments, RF energy supplied by the RF power source may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

In one or more embodiments, the processing chamber apparatus 200 comprises a substrate support 228 or pedestal spaced a distance from the front plate 222 of the showerhead 201. In some embodiments, the substrate support 228 comprises a heater 232. In some embodiments, the substrate support 228 holds a substrate 230. The temperature of the substrate 230 and the region surrounding the substrate 230 may be controlled in part by the temperature controlled substrate support 228 and heater 232. The substrate support 228 may be thermally coupled to the cooling/heating unit 232 that adjust the substrate support 228 and substrate 230 temperature to, for example, about −100° C. to about 100° C.

One or more embodiments of the disclosure are directed to a method of depositing a film on a substrate. In one or more embodiments, the method comprises flowing one or more of a precursor, an oxidant, or a reductant through a showerhead, the showerhead having a front plate and a back plate spaced to form a gas volume, the front plate having an inner surface adjacent the gas volume and an outer surface with a plurality of apertures extending therethrough, the gas volume having a center region and an outer region, an inlet in fluid communication with the center region of the gas volume, the inlet having an inside and an outside; and a mixer disposed on the inside of the inlet to increase gas flow temperature. A flow is then delivered from the front plate of the showerhead to a substrate, and a film is formed on the substrate. In some embodiments, the mixer increases a temperature of the flow without affecting the amount of time it takes to deliver the flow.

In one or more embodiments, as illustrated in FIG. 2, the processing chamber apparatus 200 is controlled by a controller 290. In an exemplary embodiment, the controller 290 includes a hard disk drive, a floppy disk drive, and a processor. The processor contains a single-board computer (SBC), analog and digital input/output boards, interface boards, and stepper motor controller boards. Various parts of the processing chamber apparatus 200 conform to the Versa Modular European (VME) standard which defines board, card cage, and connector dimensions and types. The VME standard also defines the bus structure as having a 16-bit data bus and a 24-bit address bus.

The controller 290 controls all of the activities of the processing chamber apparatus 200. The controller executes system control software, which is a computer program stored in a computer-readable medium. The medium may be a hard disk drive, or other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

The controller 290 includes a central processing unit (CPU) 292, a memory 294, one or more support circuits 296 utilized to control the process sequence and regulate the gas flows, and an input/output (I/O) 298. The CPU 292 may be of any form of a general-purpose computer processor that may be used in an industrial setting. The software routines can be stored in the memory 294, such as random access memory, read only memory, floppy, or hard disk drive, or other form of digital storage. The support circuit 296 is conventionally coupled to the CPU 292 and may include cache, clock circuits, input/output systems, power supplies, and the like.

The memory 294 can include one or more of transitory memory (e.g., random access memory) and non-transitory memory (e.g., storage). The memory 294, or computer-readable medium, of the processor may be one or more of readily available memory such as random access memory (RAM), read-only memory (ROM), floppy disk, hard disk, or any other form of digital storage, local or remote. The memory 294 can retain an instruction set that is operable by the processor to control parameters and components of the system.

Processes may generally be stored in the memory 294 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller 290) that controls the chamber operation such that the processes are performed.

The controller 290 of some embodiments is configured to interact with hardware to perform the programmed function. For example, the controller 290 can be configured to control one or more valves, motors, actuators, power supplies, etc.

In some embodiments, a controller 290 is coupled to the chamber apparatus 221. The controller has one or more configurations to control the various functions and processes. In some embodiments, the configurations are selected from a first configuration to rotate the substrate support about a central axis, a second configuration to provide a flow of gas into a non-plasma processing region, a third configuration to provide a flow of gas into a plasma processing region, a fourth configuration to provide power to the plasma processing region to ignite a plasma and/or a fifth configuration to pulse the power to the plasma processing region to generate an ON time and an OFF time for the plasma processing region.

According to one or more embodiments, the substrate is subjected to processing prior to and/or after forming a layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A gas distribution apparatus comprising:
    a showerhead having a front plate and a back plate spaced to form a gas volume, the front plate having an inner surface adjacent the gas volume and an outer surface with a plurality of apertures extending therethrough, the gas volume having a center region and an outer region;
    a first inlet in fluid communication with the center region of the gas volume, the inlet having an inside and an outside;
    a mixer disposed on the inside of the first inlet to increase gas flow temperature; and
    optionally, a second inlet in fluid communication with the first inlet, the second inlet substantially perpendicular to the first inlet.

2. The apparatus of claim 1, wherein the mixer is located at an entrance of the inside of the first inlet.

3. The apparatus of claim 1, wherein the back plate of the showerhead is angled toward the front plate at the outer region of the gas volume to form a funnel shape.

4. The apparatus of claim 3, wherein the first inlet creates a vortex spiraling outward from the center region to the outer region of the gas volume.

5. The apparatus of claim 3, wherein the front plate is connected to an RF power source.

6. The apparatus of claim 1, wherein the showerhead further comprises at least one sidewall connecting the front plate to the back plate and defining an outer peripheral edge of the outer region of the gas volume.

7. The apparatus of claim 6, wherein the at least one sidewall is an insulator to electrically separate the front plate from the back plate.

8. The apparatus of claim 7, wherein one of the front plate and the back plate is connected to an RF power source and the other of the front plate and the back plate is connected to electrical ground to generate a plasma within the gas volume.

9. The apparatus of claim 1, wherein the mixer is disposed on the inside of the first inlet at some point between the entrance of the first inlet and about the top of the back plate of the showerhead.

10. A processing chamber apparatus comprising:
a chamber body having a top wall, bottom wall and at least one sidewall defining a processing volume;
a showerhead having a front plate and a back plate spaced to form a gas volume, the front plate having an inner surface adjacent the gas volume and an outer surface with a plurality of apertures extending therethrough, the gas volume having a center region and an outer region, a first inlet in fluid communication with the center region of the gas volume, the first inlet having an inside and an outside, a mixer disposed on the inside of the inlet to increase gas flow temperature, and, optionally, a second inlet in fluid communication with the first inlet, the second inlet substantially perpendicular to the first inlet; and
a substrate support spaced a distance from the front plate of the showerhead.

11. The apparatus of claim 10, wherein the mixer is located at an entrance of the inside of the first inlet.

12. The apparatus of claim 10, wherein the back plate of the showerhead is angled toward the front plate at the outer region of the gas volume to form a funnel shape.

13. The apparatus of claim 12, wherein the first inlet creates a vortex spiraling outward from the center region to the outer region of the gas volume.

14. The apparatus of claim 12, wherein the front plate is connected to an RF power source.

15. The apparatus of claim 10, wherein the showerhead further comprises at least one sidewall connecting the front plate to the back plate and defining an outer peripheral edge of the outer region of the gas volume.

16. The apparatus of claim 15, wherein the at least one sidewall of the showerhead is an insulator to electrically separate the front plate from the back plate.

17. The apparatus of claim 16, wherein one of the front plate and the back plate is connected to an RF power source and the other of the front plate and the back plate is connected to electrical ground to generate a plasma within the gas volume.

18. The apparatus of claim 10, wherein the substrate support comprises a heater.

19. The apparatus of claim 10, wherein the apparatus comprises a chemical vapor deposition apparatus.

20. A method of depositing a film on a substrate, the method comprising:
flowing one or more of a precursor, an oxidant, or a reductant through a showerhead, the showerhead having a front plate and a back plate spaced to form a gas volume, the front plate having an inner surface adjacent the gas volume and an outer surface with a plurality of apertures extending therethrough, the gas volume having a center region and an outer region, a first inlet in fluid communication with the center region of the gas volume, the first inlet having an inside and an outside, a mixer disposed on the inside of the first inlet to increase gas flow temperature, and a second inlet in fluid communication with the first inlet, the second inlet substantially perpendicular to the first inlet;
delivering a flow from the front plate of the showerhead to a substrate; and
forming a film on the substrate,
wherein the mixer increases a temperature of the flow without affecting the amount of time it takes to deliver the flow.

* * * * *